United States Patent
Ono

(12) 
(10) Patent No.: US 6,505,741 B1
(45) Date of Patent: Jan. 14, 2003

(54) TRAY FOR RECEIVING SEMICONDUCTOR DEVICES

(76) Inventor: Hirokazu Ono, 1-15-607 Hatanaka 3-chome, Niiza-shi, Saitama-ken (JP)

( * ) Notice: Subject to any disclaimer, the term of this patent is extended or adjusted under 35 U.S.C. 154(b) by 77 days.

(21) Appl. No.: 09/708,730

(22) Filed: Nov. 9, 2000

(51) Int. Cl.⁷ .............................................. B65D 85/00
(52) U.S. Cl. ...................... 206/722; 206/725; 206/724; 220/4.27
(58) Field of Search ................................ 206/722, 725, 206/724, 564, 509, 511; 220/4.27

(56) References Cited

U.S. PATENT DOCUMENTS

| | | | | | |
|---|---|---|---|---|---|
| RE32,344 E | * | 2/1987 | Wind | ........................ | 206/599 |
| 5,418,692 A | * | 5/1995 | Nemoto | ........................ | 361/809 |
| 5,492,223 A | * | 2/1996 | Boardman et al. | ........... | 206/710 |
| 5,746,319 A | * | 5/1998 | Murphy | ........................ | 206/725 |
| 5,988,394 A | * | 11/1999 | Emoto et al. | .............. | 206/724 |

FOREIGN PATENT DOCUMENTS

| | | |
|---|---|---|
| JP | 2-45381 | 2/1990 |
| JP | 7-112785 | 5/1995 |
| JP | 2588332 | 10/1998 |
| JP | 2852872 | 11/1998 |

* cited by examiner

Primary Examiner—Mickey Yu
Assistant Examiner—Troy Arnold
(74) Attorney, Agent, or Firm—Kanesaka & Takeuchi

(57) ABSTRACT

A tray for receiving semiconductor devices is formed of a main portion having supporting surfaces, and a plurality of columnar bosses formed on the top and bottom supporting surfaces of the main portion to surround and couple with outer perimeters of semiconductor devices. The columnar bosses are formed to be situated adjacent to each other when two trays are piled. The tray can be formed economically without deformation.

7 Claims, 9 Drawing Sheets

TRAY FOR RECEIVING SEMICONDUCTOR DEVICES

BACKGROUND OF THE INVENTION AND RELATED ART STATEMENT

The present invention relates to a tray for receiving semiconductor devices, and more specifically, it relates to a tray for receiving semiconductor devices which is injection molded by using conductive plastics.

Recently, miniaturization of semiconductor devices (IC) through large-scale integration is advancing, and they are developing from a pin grid array (PGA) type to a ball grid array (BGA), and furthermore to a land grid array (LGA).

In order to stock and transport these semiconductor devices, specific receiving trays (herein after, simply called tray) are used. These trays are used naturally in order to protect the semiconductor devices in handling, as well as to make handling easier in both manual and automatic loading operations.

Also, in manufacturing of these trays, rapid response to the speed of development of the semiconductor devices is required. Furthermore, in addition to reduction of cost, shortening of delivery period is required.

Numerous trays for housing the aforementioned PGA type, BGA type, and LGA type semiconductor devices have been developed and provided to be adapted to the shapes of the semiconductor devices, and one example is shown in FIG. 11 and FIG. 12. These drawings do not show the entire tray, but rather, they show only one partition for housing one of a large number of arranged semiconductor devices. FIG. 11(a) shows a plan view of this partition, and FIG. 11(b) shows a sectional view taken along line 11(b)—11(b) in FIG. 11(a). FIG. 12(a) shows a sectional view taken along line 12(a)—12(a) in FIG. 11(a), and FIG. 12(b) shows a bottom view of FIG. 11(a). The semiconductor device received in this tray is a BGA type.

This tray overall has a rectangular shape, and supporting parts 101 and 102 are formed horizontally and vertically, that is, with beams in a matrix form, inside a frame (not illustrated) following the external shape of the tray. An open pocket 103 is formed by these supporting parts 101 and 102. On the bottom side of the supporting parts 101, 102, flat strip shaped ribs 101a and 102a are formed to project downwardly therefrom. A semiconductor device 105 is supported at the outer perimeter of the substrate part 105a thereof by the surfaces 101b and 102b on a plane formed by supporting parts 101 and 102 following the perimeter of that pocket 103.

Also, as shown in FIG. 11(b), supporting parts 101c and 102c are formed on the ribs 101a and 102a formed on the bottom sides of the aforementioned the supporting parts 101 and 102, and supporting surfaces 101d and 102d consisting of slopes and planes formed by the tips of these supporting parts 101c and 102c also can support the semiconductor device 105. These supporting surfaces 101d and 102d support the semiconductor devices when the trays are stacked and inverted, and they support an encapsulating resin part 105b of the semiconductor device 105.

A large number of the aforementioned semiconductor devices 105 is received by being mounted on the top side, that is, on the aforementioned supporting surfaces 101a and 102b. Also, other trays are stacked on top of this filled tray and they are placed in a mutually coupled state such that stocking and transporting, and the like, can be performed.

Incidentally, in regard to the aforementioned semiconductor device 105, the work of inspection, and the like, is performed in a state when it is mounted on the aforementioned tray. This inspection work, and the like, is performed not only from the top side of the semiconductor device 105, but also from the bottom side. When performing inspection, and the like, with respect to the top side of the semiconductor device, one may go through the working procedure while maintaining the posture of the tray, that is, with the top side placed upright. On the other hand, when performing inspection, and the like, with respect to the bottom side of the semiconductor device, it is performed in the following manner. That is, the group of trays stacked with the top side placed upright is inverted all together. By this, the semiconductor devices supported on a given tray come to be supported by supporting surfaces 101d and 102d on the bottom side of the tray now being on the lower side (refer to FIG. 11(b)).

By using a tray such as the aforementioned one, the stocking and transporting of the semiconductor devices 105, as well as all kinds of operations with respect to the semiconductor device 105, can be made easier. However, because the aforementioned tray has a large number of ribs in addition to the supporting parts 101 and 102 in matrix form so as to support the semiconductor devices on these beam shaped supporting parts and ribs, and because this tray has acute angular parts, the mold used for molding requires expensive discharge processing, and the like, and it is difficult to reduce the cost.

Also, a tray of such shape has problems such as that it is difficult to make the thickness uniform across the entirety, and warping and buckling tend to occur, and that short shot, which is a phenomenon where the melted resin does not completely spread across, occurs at the fine ribs.

Also, since the outer perimeter of the semiconductor device 105 is supported when performing inspection, and the like, of the top side of the semiconductor device, and the outer perimeter of the encapsulating resin part 105b is supported when performing inspection, and the like, of the bottom side, a considerable difference arises in the two states of support. Specifically, there is a problem that the postures of the semiconductor devices during inspection of the tops and bottoms of the semiconductor devices are not constant, and the postures of the semiconductor devices on the tray may differ at the tops and the bottoms, and when the semiconductor devices are moved by inverting the tray, their postures change. This point is more prominent as the semiconductor devices are smaller.

Furthermore, in considering the handling of a plurality of kinds of the semiconductor devices having the same external shape, according to the conditions of placement of the balls, i.e. contacts, of the semiconductor devices, the tray described previously can handle those where this ball placement part fits inside the aforementioned pocket 103, but it can not be used for those where it doesn't fit. Also, since the outer perimeter of the encapsulating resin part 105b is supported when supporting the semiconductor devices with the tray inverted, there is a problem that the kinds of the semiconductor devices handled is limited also according to the shape of this encapsulating resin part.

The present invention has been made in consideration of the problems of the aforementioned prior art, and an object of the invention is to provide a tray for receiving semiconductor devices that is of simple constitution and is cheap in cost.

Another object of the invention is to provide a tray for receiving the semiconductor devices as stated above, which prevents deformation, such as warping, and is well-suited for measurement, and the like, from the top and bottom of the semiconductor.

A further object of the invention is to provide a tray for receiving the semiconductor devices as stated above, which can handle many kinds of the semiconductor devices and has high general usability.

Further objects and advantages of the invention will be apparent from the following description of the invention.

SUMMARY OF THE INVENTION

In order to achieve the aforementioned objects, the present invention is directed to a tray for receiving semiconductor devices that receives and arranges flat-type semiconductor devices, wherein a plurality of columnar bosses that couple with the outer perimeters of the semiconductor devices is integrally formed on supporting surfaces that support the semiconductor devices so as to surround the semiconductor devices.

Also, in the tray for receiving the semiconductor devices, supporting surfaces that can support the semiconductor devices are provided on top and bottom sides of the tray. A plurality of columnar bosses that couple with the perimeters of the semiconductor devices is integrally formed on the top and bottom side supporting surfaces so as to surround the semiconductor devices. The columnar bosses on the top side of the tray and the columnar bosses on the bottom side are angularly displaced around the centers of the supporting surfaces to be shifted at a specified angular degree.

Furthermore, in the tray for receiving the semiconductor devices, the supporting part with the supporting surfaces on the top side of the tray has a flat plate shape, and the supporting surfaces on the bottom side of the tray are formed on the top ends of frame shaped ribs integrally placed to project outwardly from the bottom side of the flat plate shaped supporting part.

Moreover, in the tray for receiving the semiconductor devices, the columnar bosses on the bottom side of the tray surround the semiconductor devices to form series following the outer perimeters of the semiconductor devices together with the columnar bosses on the top side of the tray when the trays are stacked, and their tips reach into the areas of the tips of the columnar bosses on the top side of the tray.

In addition, in the tray for receiving the semiconductor devices, each columnar boss on the top side and the bottom side of the tray has a conical shape, and the tip is formed in a spherical shape, or the sectional shape in a trapezoidal shape.

Furthermore, in the tray for receiving the semiconductor devices, strip shaped ribs are integrally provided between the frame shaped ribs on the bottom side of the tray.

Also, in the tray for receiving the semiconductor devices, cut-outs are formed at the locations other than the flat plate shaped supporting surfaces.

With the tray for receiving the semiconductor devices, the columnar bosses are located so as to surround the semiconductor device, and position the semiconductor device on a supporting surface.

Also, the supporting surface on the bottom side of the tray is provided in a state such that the columnar bosses on the bottom side are rotated, for example 90 degrees, around the center of the supporting surface with respect to the columnar bosses on the top side, when the trays are in a piled state. Thus, the columnar bosses on the top and bottom become in a mutually adjacent state without interfering with each other.

Also, the posture of the semiconductor devices during inspection, and the like, of the tops and bottoms of the semiconductor devices is constant, and inspection of both the top and bottom surfaces can be performed without impediment.

Furthermore, specifically, the supporting part with the supporting surfaces on the top side of the tray is made as a flat plate shape, and the frame shaped ribs are integrally placed to stick out on the bottom surface of this flat plate shaped supporting part. Also, the supporting surfaces on the bottom side of the tray are formed on the top ends of these frame shaped ribs, and the tray substantially is constituted by this flat plate shaped supporting part, the frame shaped ribs, and said columnar bosses. Thus, the structure is simple.

Moreover, the columnar bosses on the bottom side of the tray previously described surround the semiconductor devices to form series following the outer perimeters of the semiconductor devices together with the columnar bosses on the top side of the tray when the trays are stacked, and their tips reach into the areas of the tips of the columnar bosses on the top side of the tray. Thus, in performing inspection, and the like, of the bottom side of the semiconductor devices, when the stacked trays are inverted such that the semiconductor devices move to the tray now being on the lower side, the semiconductor devices move as they are without the occurrence of shifting.

Furthermore, since each columnar boss on the top side and the bottom side of the tray has a conical shape, and the tip is formed in a spherical shape or the tip is formed in a flat conical trapezoidal shape, when the semiconductor device is mounted on the tray, the semiconductor device is smoothly guided to the specified position. The shape of this columnar boss in plan view can be selected as triangular or star shape, or the like.

In addition, the strip shaped ribs provided between the frame shaped ribs on the bottom side of the tray serve as reinforcement, and the rigidity of the tray overall is increased.

Moreover, since the cut-outs are formed at the locations other than the supporting surfaces of the flat plate shaped supporting part, the lightweight tray is made, and handling in transport, and the like, becomes easier.

DETAILED DESCRIPTION OF THE PREFERRED EMBODIMENTS

Next, examples of the tray for receiving semiconductor devices according to the present invention are explained with reference to the attached drawings.

Figure 1A:
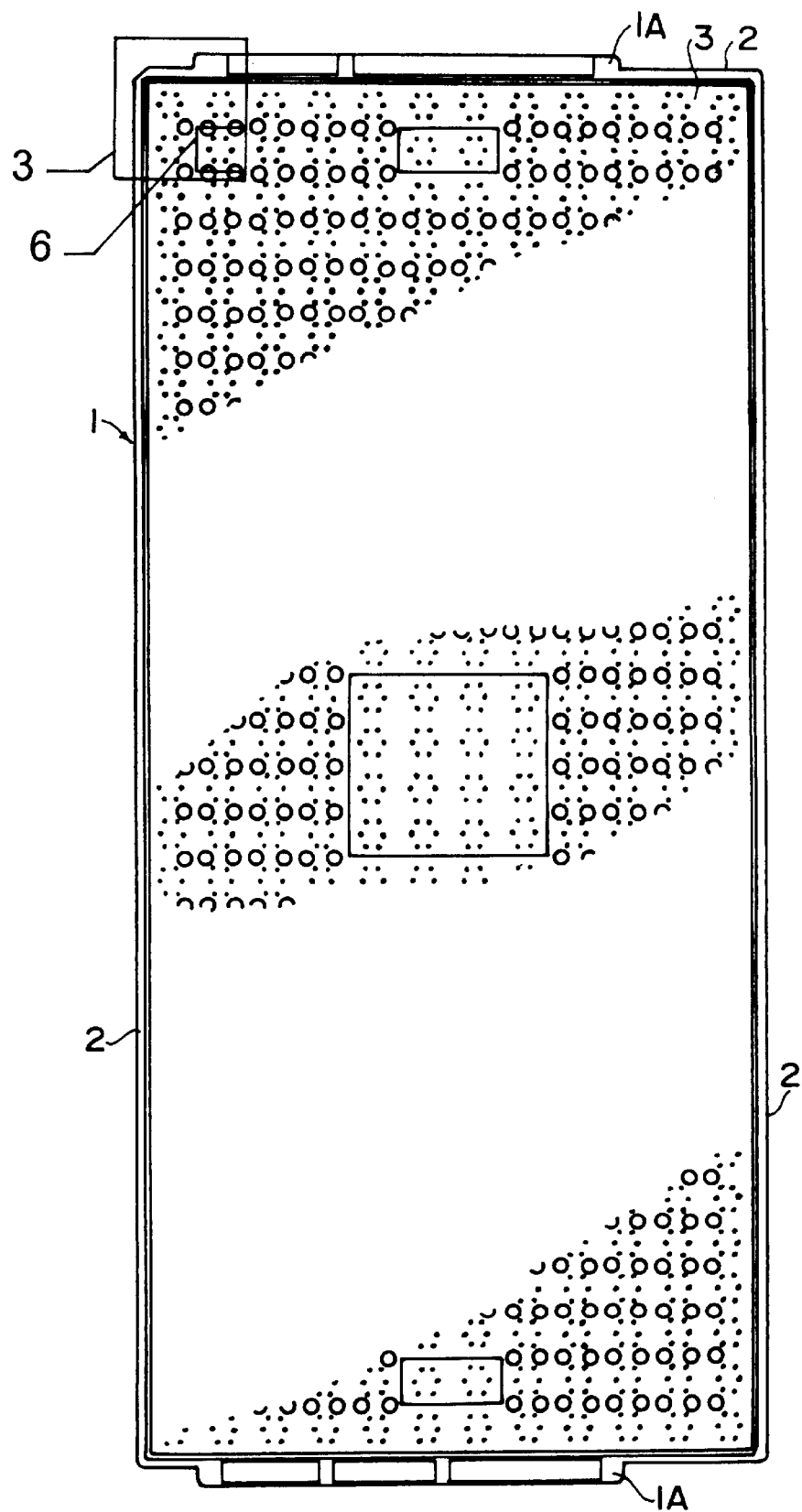
FIG. 1(a) is a plan view of a tray for receiving semiconductor devices pertaining to the present invention.
Figure 1B:
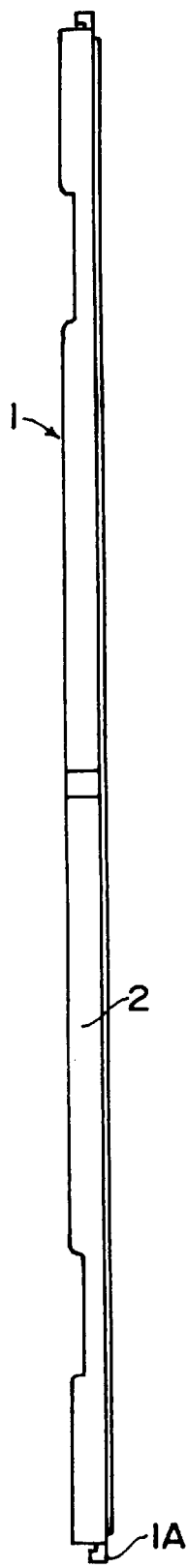
FIG. 1(b) is a let side view of the tray.
Figure 1C:
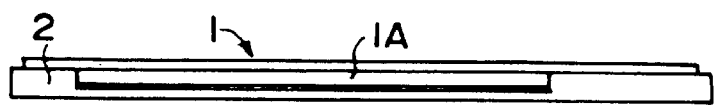
FIG. 1(c) is a front view of the tray.
Figure 2:
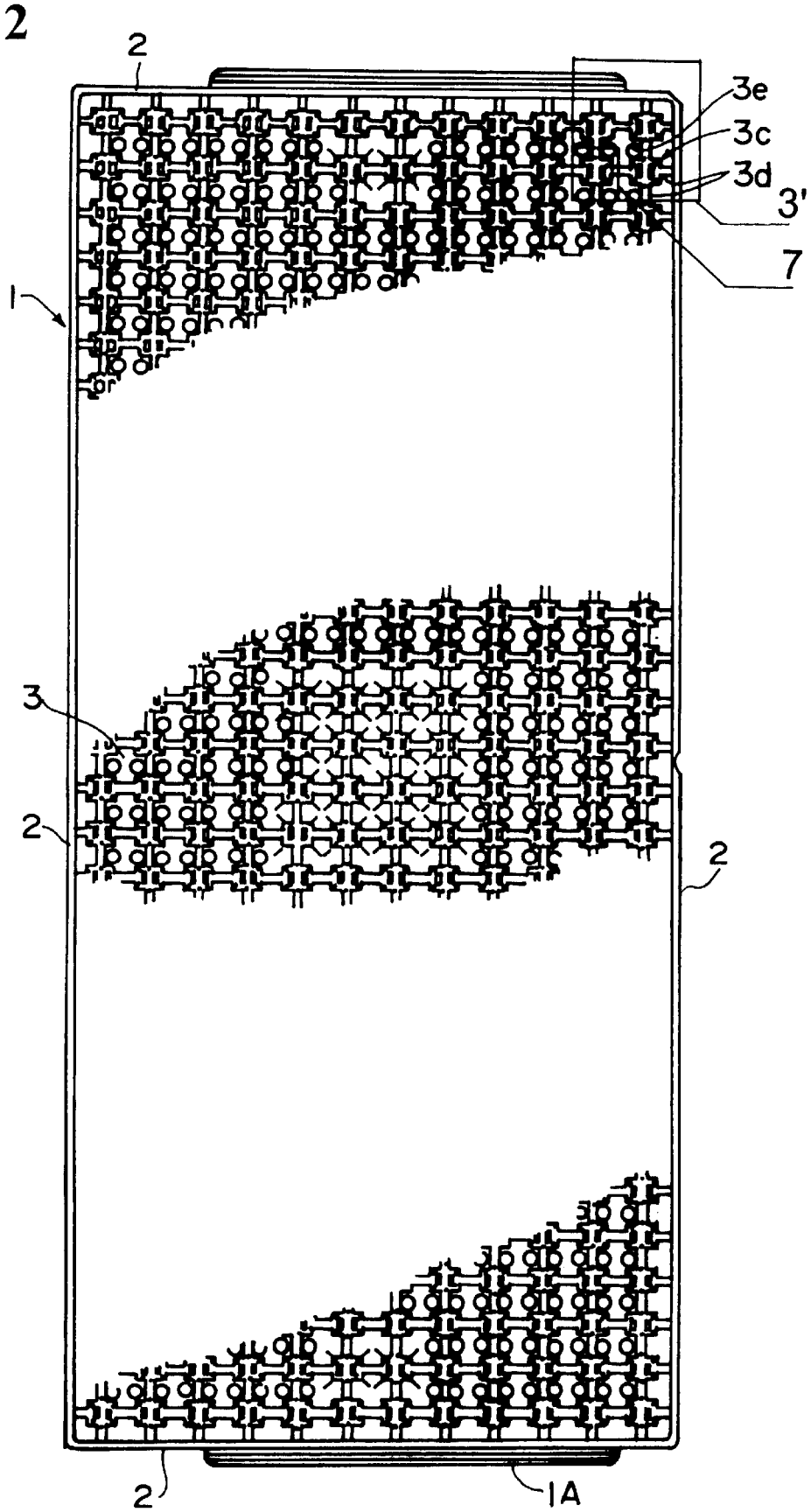
FIG. 2 is a bottom view of the tray for receiving the semiconductor devices shown in FIG. 1(a)

First, FIGS. 1(a), 1(b) and 1(c) respectively are a plan view, left side view, and front view of a tray for handling semiconductor devices pertaining to the present invention (hereinafter, simply abridged as tray) 1. FIG. 2 is a bottom view. This tray 1 is obtained by injection molding by using conductive plastic as a material, and it is formed overall into a rectangular plate shape.

Specifically, the tray 1 has a frame 2 as the overall external shape, and a flat plate shaped supporting part or main portion 3 crossing the entire area inside this frame 2. The entire surface of this supporting part 3 is partitioned into 30 partitions in the longitudinal direction of the tray 1, and 12 partitions in the lateral direction, which are of roughly equal measurement. It can support one semiconductor device in one partition or section, and it can receive and arrange a total of 366 semiconductor devices. Because the state of support of the semiconductor device on each of these partitions is about the same, hereinafter, it is explained in details with respect to several partitions. Specifically, four partitions in one corner of the tray 1 is explained. The number of the semiconductor devices supported is determined such as by the number and size of the semiconductor devices.

Figure 3:
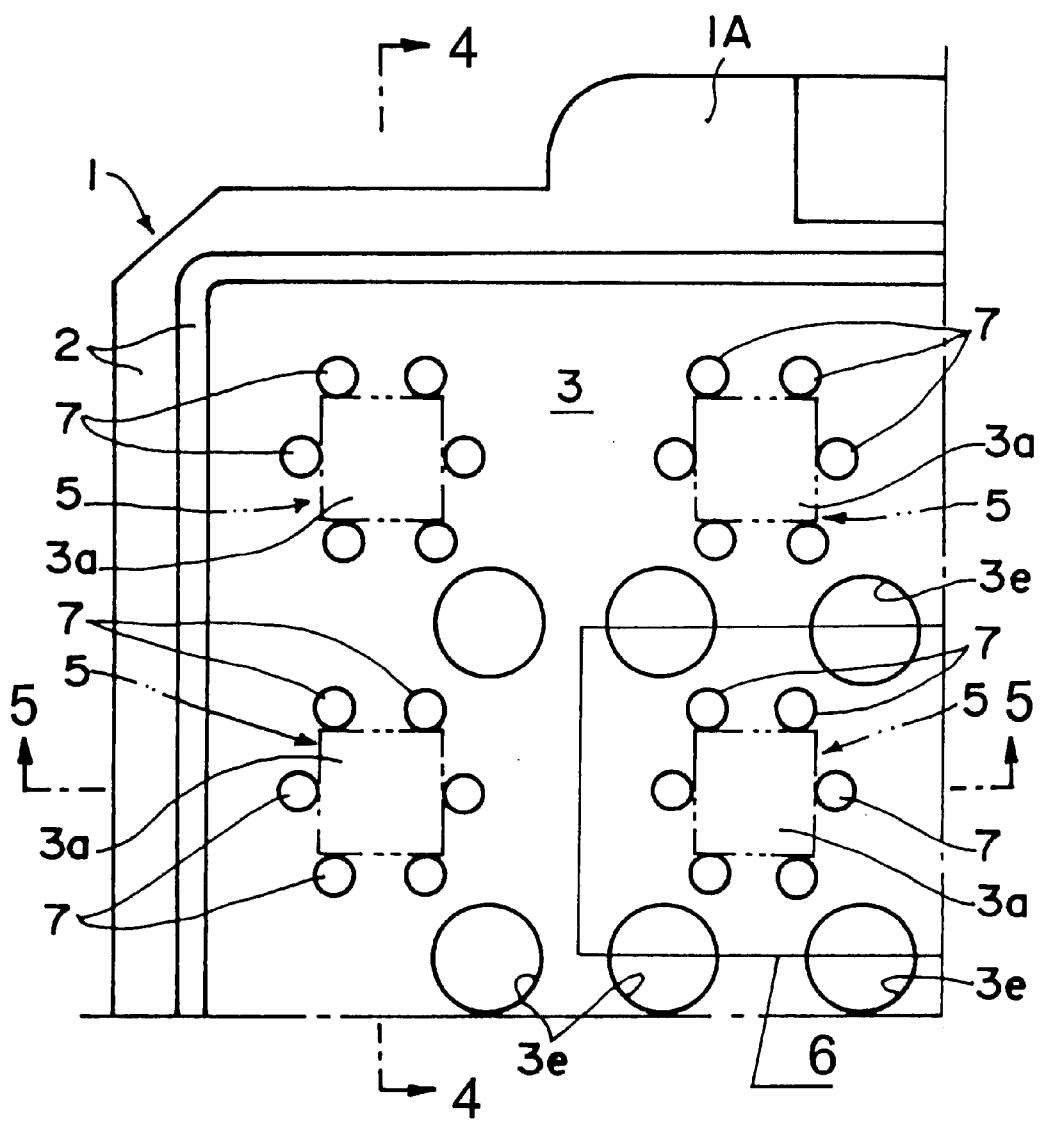
FIG. 3 is an enlarged view of a part 3 in FIG. 1.
Figure 4:
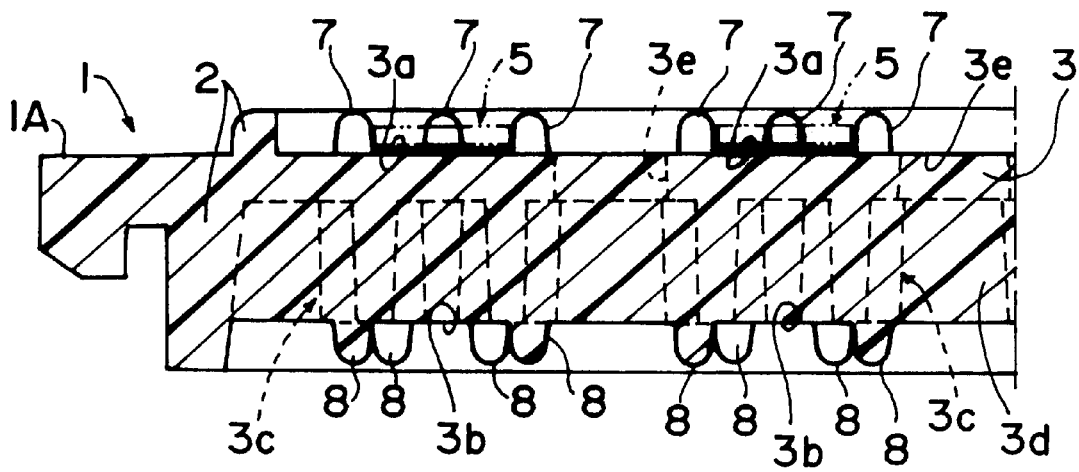
FIG. 4 is a sectional view taken along line 4—4 in FIG. 3.
Figure 5:
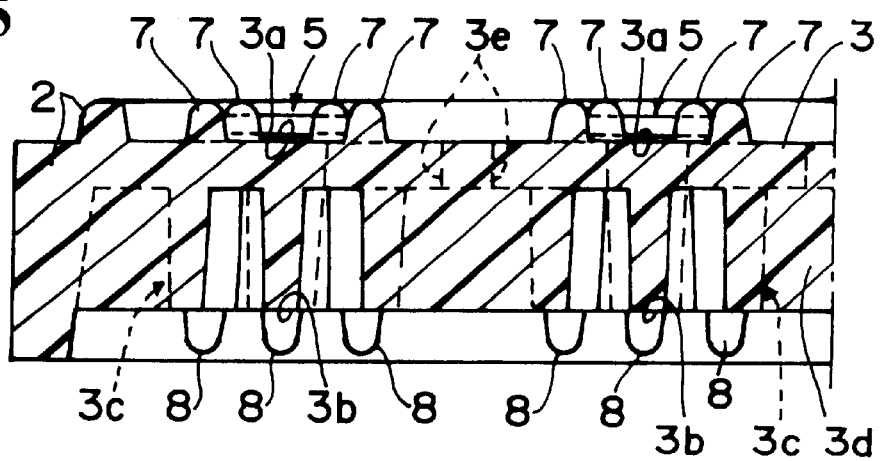
FIG. 5 is a sectional view taken along line 5—5 in FIG. 3.
Figure 6:
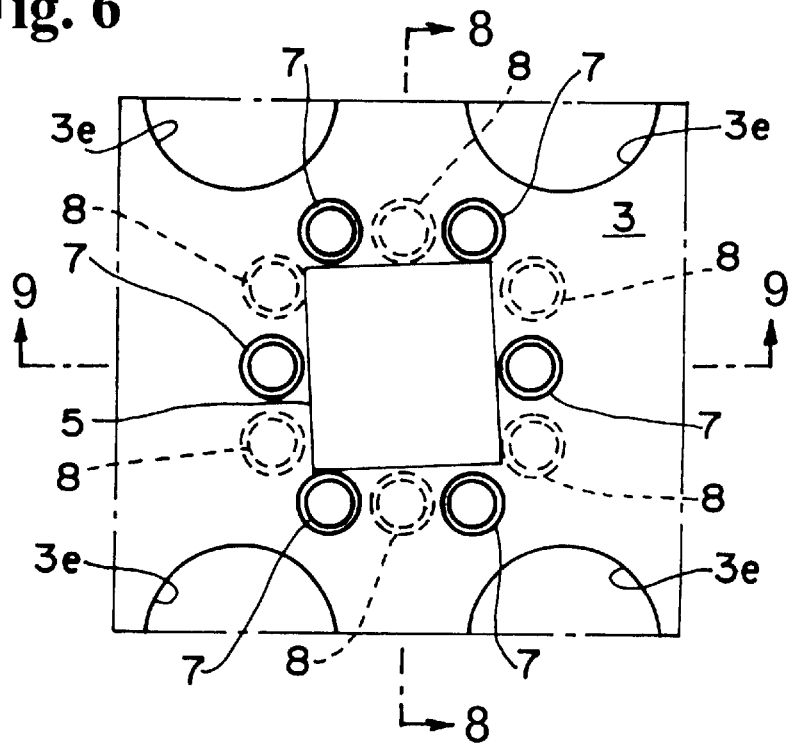
FIG. 6 is an enlarged view of a part 6 in FIG. 1 and FIG. 3.
Figure 7:
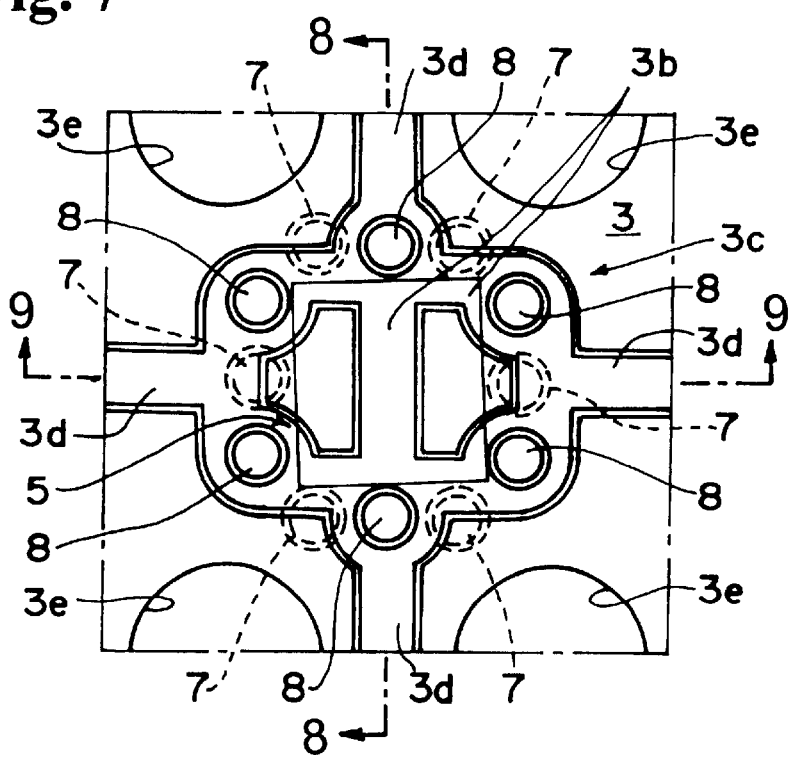
FIG. 7 is an enlarged view of a part 7 in FIG. 2.

Here, for convenience in explanation, an explanation of each drawing is given. FIG. 3 is an enlarged view of the part 3 in FIG. 1(a), and it shows four partitions to be explained. Also, FIG. 4 and FIG. 5 show the 4—4 section and 5—5 section, respectively, in FIG. 3. A part 3' in FIG. 2 shows the back side of the part 3. Furthermore, an enlarged view of a part 6 in FIG. 1(a) and FIG. 3 is shown in FIG. 6, and an enlarged view of a part 7 in FIG. 2 is shown in FIG. 7. This part 6 shown in FIG. 6 and the part 7 shown in FIG. 7 are a plan view and a back view of the same one partition. Also, FIG. 8 and FIG. 9 respectively show the section 8—8 and section 9—9 in FIG. 6 and FIG. 7, and FIG. 10 is an enlarged view of a part 10 in FIG. 8.

In the present example, the semiconductor device 5 held on the tray 1 is a BGA-type, and its external shape is roughly square. It also may receive and support LGA-type semiconductor devices.

As shown in FIG. 3 through FIG. 6, one semiconductor device 5 is mounted on a supporting surface 3a of one partition of the aforementioned supporting part 3. However, this BGA-type semiconductor device 5 is placed on the supporting part 3 with the balls, i.e. contacts, placed downward. That is, the supporting part 3 supports the entirety of the bottom surface of the semiconductor device 5. On the supporting part 3, there is formed a plurality, six in the case of the present example, of columnar bosses 7 that couple with the outer perimeter of each semiconductor device 5, and they are placed so as to surround the semiconductor device 5. These columnar bosses 7 have the same shape and same size respectively, the height is higher than the height of the semiconductor device 5, and it does not exceed the depth of the tray 1. In explaining the placement of each columnar boss specifically, one each is placed on one pair of the opposite sides of the roughly square semiconductor device 5, and two are respectively placed on the other pair of the opposite sides. This arrangement is made such that the upward and downward columnar bosses do not interfere with each other when the trays 1 are stacked.

The aforementioned each columnar boss 7 has a conical shape, and its tip is formed in a spherical shape. This shape is the same with respect to the columnar bosses on the bottom side of the tray to be explained later. Because the columnar bosses are formed in this manner, the semiconductor device 5 is smoothly guided to the specified position when the semiconductor device is mounted on the tray 1. The round columnar shape of the boss also may be a conical trapezoidal shape, and also a triangular shape, star shape, and the like, in plan view can be freely selected.

Meanwhile, as shown in FIGS. 4, 5 and 7, the bottom side of the tray 1 also is provided with supporting surfaces 3b for supporting the semiconductor devices 5. This supporting surface 3b is placed on the directly opposite face of the aforementioned supporting surface 3a on the top side of the tray. This supporting surface 3b is formed on the top end of a frame-shaped rib 3c formed to project on the bottom surface of the flat plate shaped supporting part 3.

On the supporting surface 3b on the bottom side of the aforementioned tray, there is formed a plurality, six in this case, of other columnar bosses 8 surrounding the semiconductor device 5 following the outer perimeter of the semiconductor device 5. In these columnar bosses 8, specifically, one each is placed on one pair of the opposite sides of the semiconductor device 5, and two are respectively placed on the other pair of the opposite sides.

In regard to the semiconductor device 5, the work of inspection, and the like, is performed, and it is provided to the work in a state being mounted on tray 1. Often, the inspection, and the like, is performed not only for the top side of the semiconductor device 5, but also with respect to the bottom side. These supporting surface 3b and columnar bosses 8 on the bottom side of the tray are used when performing inspection, and the like, with respect to the bottom side of the semiconductor device 5.

When the inspection is made with respect to the top side of the semiconductor device 5, it should be provided to the working procedure while maintaining the posture in the tray 1, that is, with the top side placed upright. On the other hand, when the inspection is made with respect to the bottom side of the semiconductor device 5, it is performed in the following manner. The trays 1 with the semiconductor devices 5 on the supporting surfaces 3a are stacked into a plurality of stages, and this is inverted all together, whereby the semiconductor devices 5 on the supporting surfaces 3a come to be moved onto the supporting surfaces 3b. By this, the semiconductor devices 5 supported on a given tray come to be supported by the supporting surfaces 3b on the bottom side of the tray 1 now being on the lower side, and the bottom side of the device becomes the top side.

Here, the angular positions of the columnar bosses 7 on the top side of the tray and the columnar bosses 8 on the bottom side of the tray around the centers of the supporting surface 3a and 3b are mutually shifted at a specified angular degree, 90 degrees in the case of the present working example. This is due to the following reason.

When it is necessary to invert the semiconductor devices 5, the trays 1 on which the semiconductor devices 5 are received are stacked, and these are inverted all together, whereby the vertical posture of the semiconductor devices 5 can be inverted. In the event of this inversion operation, the trays 1 are stacked in the vertical direction, and it is necessary that there does not occur an interference phenomenon by mutual collision of the ends of the columnar bosses formed on both the top and bottom sides of the trays 1 at this time.

Thus, in order to prevent this interference phenomenon, more specifically, the positions of the columnar bosses are offset by 90 degrees such that they become in a state where they do not bump each other and they bite into each other.

Figure 8:
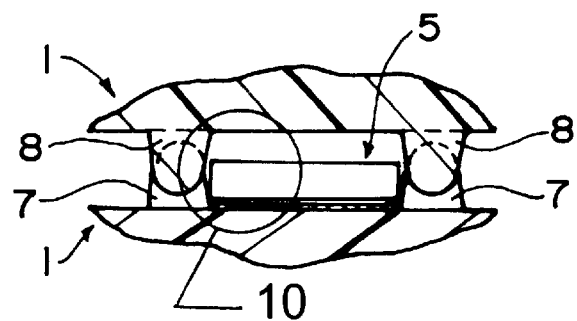
FIG. 8 is a sectional view taken along line 8—8 in FIG. 6 and FIG. 7.
Figure 9:
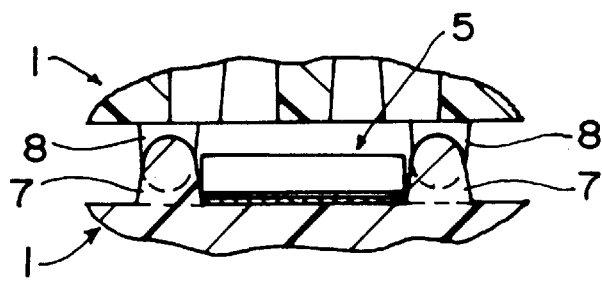
FIG. 9 is a sectional view taken along line 9—9 in FIG. 6 and FIG. 7.
Figure 10:
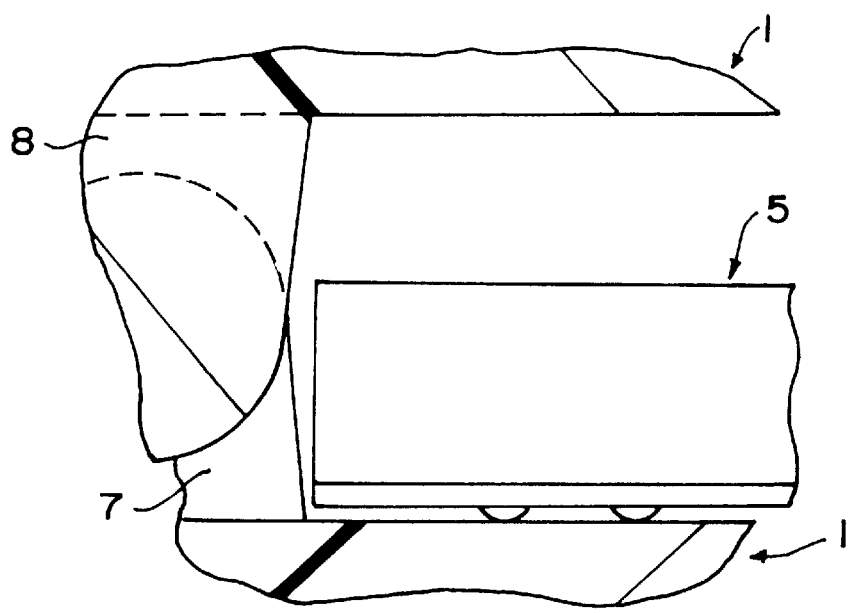
FIG. 10 is an enlarged view of a part 10 in FIG. 8.
Figure 11A:
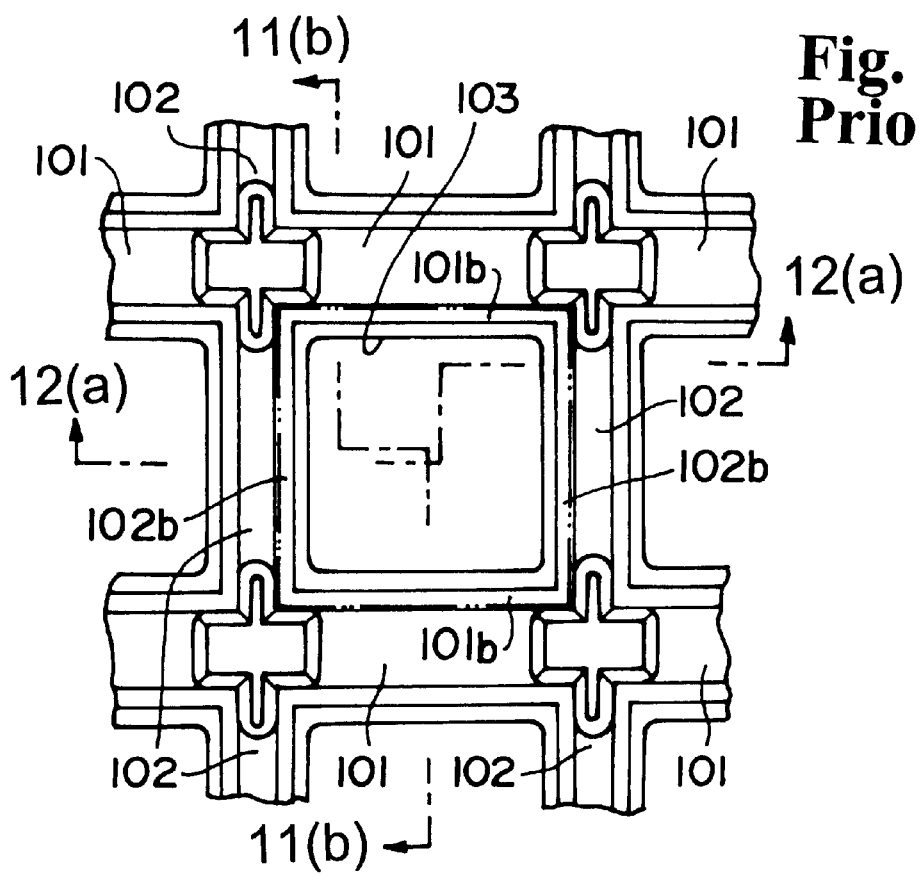
FIG. 11(a) is a plan view of one partition of a conventional tray.
Figure 11B:
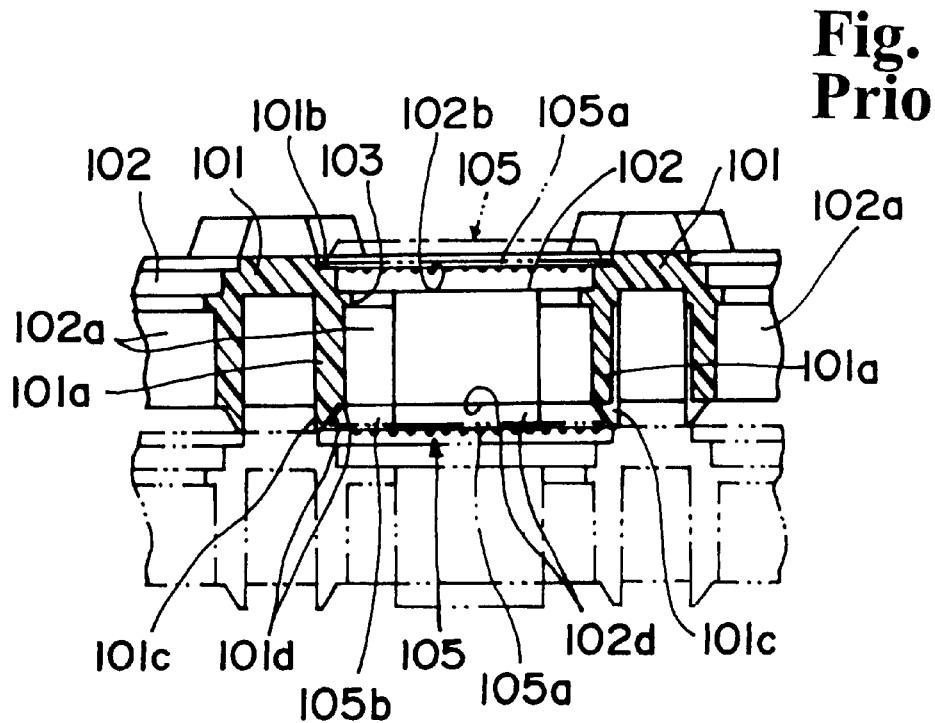
FIG. 11(b) is a sectional view taken along line 11(b)—11(b) in FIG. 11(a)
Figure 12A:
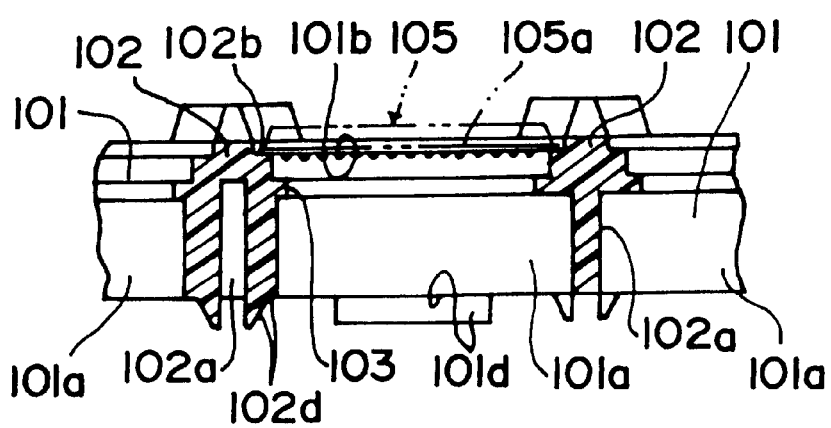
FIG. 12(a) is a sectional view taken along line 12(a)—12(a) in FIG. 11(a)
Figure 12B:
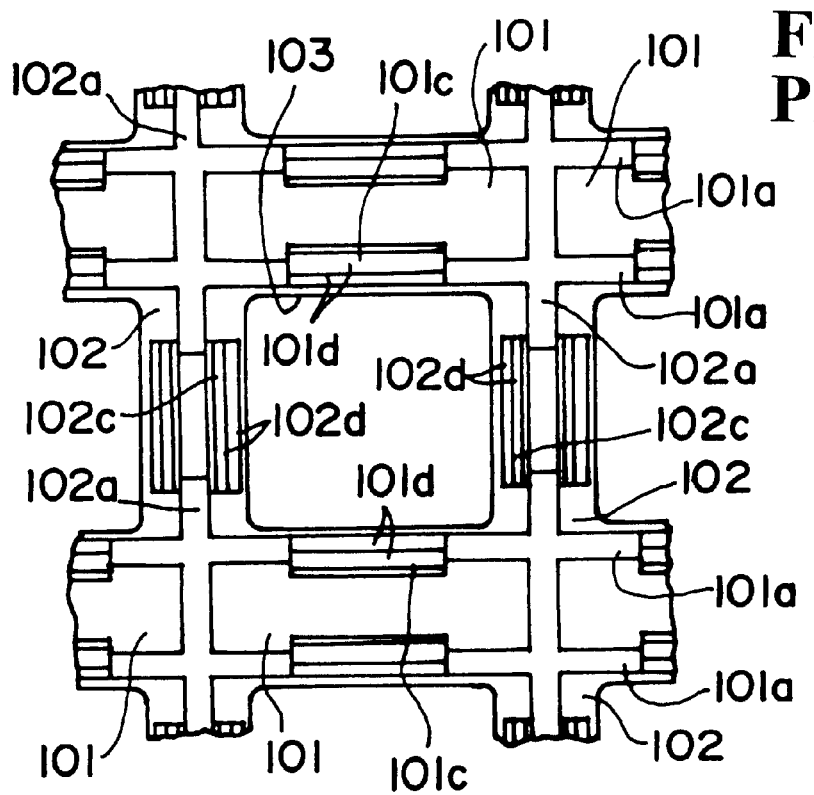
FIG. 12(b) is a bottom view of FIG. 11(a).

Also, as is clear from FIG. 6 through FIG. 10, the columnar bosses 8 on the bottom side of the aforementioned tray surround the semiconductor devices 5 forming series following the outer perimeters of the semiconductor devices 5 together with the columnar bosses 7 on the top side of the tray when the trays 1 are stacked, and their tips reach into the areas of the tips of the columnar bosses 7 on the top side of the tray (refer to FIG. 8 through FIG. 10). By this, in inspecting the bottom side of the semiconductor devices 5, when the semiconductor devices 5 are moved to the tray 1 now being on the lower side by inverting the stacked trays 1, the semiconductor devices can be moved as they are without the occurrence of shifting laterally.

Accordingly, the semiconductor devices 5 are subjected to movement and transport while being received inside the spaces surrounded by the columnar bosses 7 and 8 in the state when the trays 1 are stacked. By this, as long as the trays 1 in overlaid state are stacked, the semiconductor device 5 do not fall out.

To sum up, the round columnar bosses 7 on the top side of the tray and the round columnar bosses 8 on the bottom side of the tray are placed in a positional relationship where they do not interfere with each other (do not bump into each other) when the trays 1 are in the stacked state, and that relationship is shown in FIG. 6 and FIG. 7.

Incidentally, this tray 1 further has the following constitution added, specifically, as shown in FIGS. 2, 4, 5 and 7. Namely, strip-shaped ribs 3d are integrally provided among the frame-shaped ribs 3c provided on the bottom side of the tray. These strip-shaped ribs 3d serve as reinforcement, and they increase the overall rigidity of the tray.

Also, as shown in FIG. 2 through FIG. 7, cut-outs 3e, for example circular, are formed to the parts other than the supporting surfaces 3a of the flat plate shaped supporting part 3 of the tray 1. Therefore, the tray is made to have lightweight, and that is convenient in transport and handling.

In the present embodiment, the entire surface of the BGA-type semiconductor device 5 is supported on the supporting surface, while the semiconductor device is supported by contacting the balls or contacts with the supporting surface of the tray 1. In the above explanation, the expressions of "top and bottom" of the tray 1 are made, but these are to be understood in the sense of FIG. 1(a) and FIG. 2, and not in the general sense of the words "top and bottom."

As is clear from the above explanation, the tray for receiving the semiconductor devices according to the present invention has a plurality of the columnar bosses, that couple with the outer perimeters of the semiconductor devices, to be integrally formed on the supporting surfaces that support the semiconductor devices so as to surround the semiconductor devices. Accordingly, the constitution of the tray has become simpler. Specifically, the supporting part with the supporting surfaces on the top side of the tray is made as a flat plate shape, the frame shaped ribs are formed to project on the bottom surface of this flat plate shaped supporting part, and the supporting surfaces on the bottom side of the tray are formed on the top ends of these frame shaped ribs. Thus, the tray is substantially constituted by this flat plate shaped supporting part, the frame shaped ribs, and the columnar bosses. Therefore, the mold for injection molding the tray is simple, manufacturing of the mold becomes extremely easy, and the cost is reduced.

Also, since the structure of the tray is simple, the thickness is easily made uniform across the entirety of the tray, and deformation such as warping tends not to occur.

Also, in performing inspection, measurement, and the like, from both the top and bottom sides of the semiconductor devices, the angular positions of the semiconductor devices become constant without changing in the state of support of the semiconductor devices between the upright state and the upside down state, and it is well suited when the mutual angular position must be made constant in correlating with the inspection matter.

Furthermore, in considering the handling of a plurality of kinds of the semiconductor devices having the same external shapes, since the semiconductor devices are supported on all surfaces and the outer perimeters are positioned by the columnar bosses, many kinds of semiconductor devices can be handled, for example, with no influence at all on the placement of the balls or contacts in the case of BGA-type semiconductor devices, and the general usability is high.

While the invention is explained with reference to the specific embodiments of the invention, the explanation is illustrative and the invention is limited only by the appended claims.

What is claimed is:

1. A tray for receiving semiconductor devices comprising, a main portion having top and bottom surfaces at opposite sides thereof as supporting surfaces, and a plurality of columnar bosses formed on the top and bottom surfaces of the main portion to project in opposite directions therefrom to be able to surround and couple with outer perimeters of the semiconductor devices and having a conical shape, said columnar bosses on the top surface of the tray and the columnar bosses on the bottom surface being shifted at a specified angular degree around centers of the supporting surfaces so that when a bottom surface of one tray is piled on a top surface of another tray, columnar bosses projecting from the bottom and top surfaces do not collide with each other and hold the semiconductor device among the columnar bosses between the one and another trays.

2. A tray for receiving semiconductor devices as defined in claim 1, wherein said top and bottom surfaces have supporting areas surrounded by the columnar bosses and arranged symmetrically relative to a plane between the supporting surfaces of the main portion, said columnar bosses on the top surface being shifted relative to the columnar bosses on the bottom surface so that when the one and another trays are piled together, the columnar bosses on the bottom surface of the one tray and the columnar bosses on the top surface of the another tray are situated side by side without colliding each other.

3. A tray for receiving semiconductor devices as defined in claim 1, wherein said main portion has supporting areas of the semiconductor devices with flat plate shapes on the top side of the tray, and frame shape ribs integrally formed with the main portion at the bottom side and projecting downwardly therefrom, said ribs having supporting parts of the semiconductor devices thereon.

4. A tray for receiving semiconductor devices as defined in claim 1, wherein the columnar bosses on the bottom side of the tray surround the semiconductor devices to form series together with the columnar bosses on the top side of the tray when two trays are stacked, tips of the columnar bosses on the bottom side reaching areas of tips of the columnar bosses on the top side of the tray.

5. A tray for receiving semiconductor devices as defined in claim 4, wherein each columnar boss on the top side and the bottom side of the tray has a tip in a spherical shape.

6. A tray for receiving semiconductor devices as defined in claim 3, wherein said main portion further includes strip shaped ribs integrally provided between the frame shaped ribs on the bottom side of the tray.

7. A tray for receiving semiconductor devices as defined in claim 6, wherein said main portion further includes cut-outs at locations other than the flat plate shaped supporting surfaces.

\* \* \* \* \*